(12) United States Patent
Bandholz et al.

(10) Patent No.: US 7,945,740 B2
(45) Date of Patent: *May 17, 2011

(54) STRUCTURE FOR A MEMORY SWITCHING DATA PROCESSING SYSTEM

(75) Inventors: Justin P. Bandholz, Cary, NC (US); Zachary B. Durham, Asheboro, NC (US); Clifton E. Kerr, Durham, NC (US); Joseph E. Maxwell, Cary, NC (US); Kevin M. Reinberg, Chapel Hill, NC (US); Kevin S. D. Vernon, Durham, NC (US); Philip L. Weinstein, Apex, NC (US); Christopher C. West, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 323 days.

This patent is subject to a terminal disclaimer.

(21) Appl. No.: 12/114,992

(22) Filed: May 5, 2008

(65) Prior Publication Data
US 2009/0083472 A1 Mar. 26, 2009

Related U.S. Application Data

(63) Continuation-in-part of application No. 11/859,835, filed on Sep. 24, 2007.

(51) Int. Cl.
*G06F 12/00* (2006.01)
*G06F 13/00* (2006.01)
*G06F 13/28* (2006.01)

(52) U.S. Cl. ........ 711/148; 711/170; 711/171; 711/172; 710/316

(58) Field of Classification Search .............. 711/148, 711/170–173; 710/8, 14, 17, 36–38, 104, 710/316

See application file for complete search history.

(56) References Cited

U.S. PATENT DOCUMENTS

| | | | | |
|---|---|---|---|---|
| 5,996,051 | A * | 11/1999 | Mergard | 711/147 |
| 6,070,217 | A * | 5/2000 | Connolly et al. | 710/316 |
| 6,209,123 | B1 * | 3/2001 | Maziasz et al. | 716/14 |
| 6,266,252 | B1 * | 7/2001 | Karabatsos | 361/788 |
| 6,321,284 | B1 * | 11/2001 | Shinohara et al. | 710/113 |
| 6,446,158 | B1 * | 9/2002 | Karabatsos | 711/5 |
| 6,467,018 | B1 * | 10/2002 | Dell et al. | 711/105 |
| 6,826,657 | B1 * | 11/2004 | Ware et al. | 711/149 |
| 2001/0042225 | A1 | 11/2001 | Cepulis et al. | |
| 2004/0236877 | A1 * | 11/2004 | Burton | 710/22 |

(Continued)

OTHER PUBLICATIONS

U.S. Appl. No. 11/589,835, filed Sep. 24, 2007, entitled, "A Memory Switching Data Processing System,".

*Primary Examiner* — Yaima Campos
(74) *Attorney, Agent, or Firm* — Patterson & Sheridan, LLP (57) ABSTRACT

A design structure embodied in a machine readable storage medium for designing, manufacturing, and/or testing a memory switching data processing system is provided. The memory switching data processing system includes one or more central processing units ('CPUs'); random access memory organized in at least two banks of memory modules; one or more memory buses providing communications paths for data among the CPUs and the memory modules; and a flexibly configurable memory bus switch comprising a first configuration adapting the first CPU to a first bank of memory modules and a second CPU to a second bank of memory modules and a second configuration adapting the first CPU to both the first bank of memory modules and the second bank of memory modules.

18 Claims, 5 Drawing Sheets

U.S. PATENT DOCUMENTS

| | | |
|---|---|---|
| 2005/0028068 A1 | 2/2005 | Larson et al. |
| 2005/0235117 A1* | 10/2005 | Floman et al. ............... 711/149 |
| 2006/0004981 A1 | 1/2006 | Bains |
| 2007/0127282 A1* | 6/2007 | Klein ............................. 365/63 |
| 2008/0177913 A1* | 7/2008 | Li ................................. 710/100 |
| 2009/0083472 A1 | 3/2009 | Bandholz et al. |

* cited by examiner

STRUCTURE FOR A MEMORY SWITCHING DATA PROCESSING SYSTEM

CROSS-REFERENCE TO RELATED APPLICATION

This application is a continuation-in-part of co-pending U.S. patent application Ser. No. 11/859,835, filed Sep. 24, 2007, which is herein incorporated by reference.

BACKGROUND OF THE INVENTION

1. Field of the Invention

The field of the invention is generally related to design structures, and more specifically, design structures for a memory switching data processing system.

2. Description of Related Art

The development of the Electronic Discrete Variable Automatic Computer ('EDVAC') of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One of the areas of computer technology that has seen considerable advancement is the ability of designers and manufacturers to aggregate more and more computer power and resources into smaller and smaller form factors. As a result, the available board space and thermal capabilities in tight form factors such as, for example, blade servers, are becoming limited. In the standard two-socket implementation using computer processors or 'CPUs' with integral memory controllers, the available space for system memory is split between the processors. A processor may be able to support more modules of memory than the available space or thermal density will allow. If only one CPU is installed in the system, it is limited to one-half of the memory capacity it could use. The known solutions, inflexible and expensive, are to design another blade server for single CPU applications, or design a two-piece blade, with single and dual CPU versions of the processor complex.

SUMMARY OF THE INVENTION

A memory switching data processing system, methods of operation, and computer program products, including one or more central processing units ('CPUs'); random access memory organized in at least two banks of memory modules; one or more memory buses providing communications paths for data among the CPUs and the memory modules; and a flexibly configurable memory bus switch comprising a first configuration adapting the first CPU to a first bank of memory modules and a second CPU to a second bank of memory modules and a second configuration adapting the first CPU to both the first bank of memory modules and the second bank of memory modules.

In one embodiment, a design structure embodied in a machine readable storage medium for at least one of designing, manufacturing, and testing a design is provided. The design structure generally includes a memory switching data processing system. The system generally includes one or more central processing units ('CPUs'), random access memory organized in at least two banks of memory modules, one or more memory buses providing communications paths for data among the CPUs and the memory modules; and a flexibly configurable memory bus switch comprising a first configuration adapting the first CPU to a first bank of memory modules and a second CPU to a second bank of memory modules and a second configuration adapting the first CPU to both the first bank of memory modules and the second bank of memory modules.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
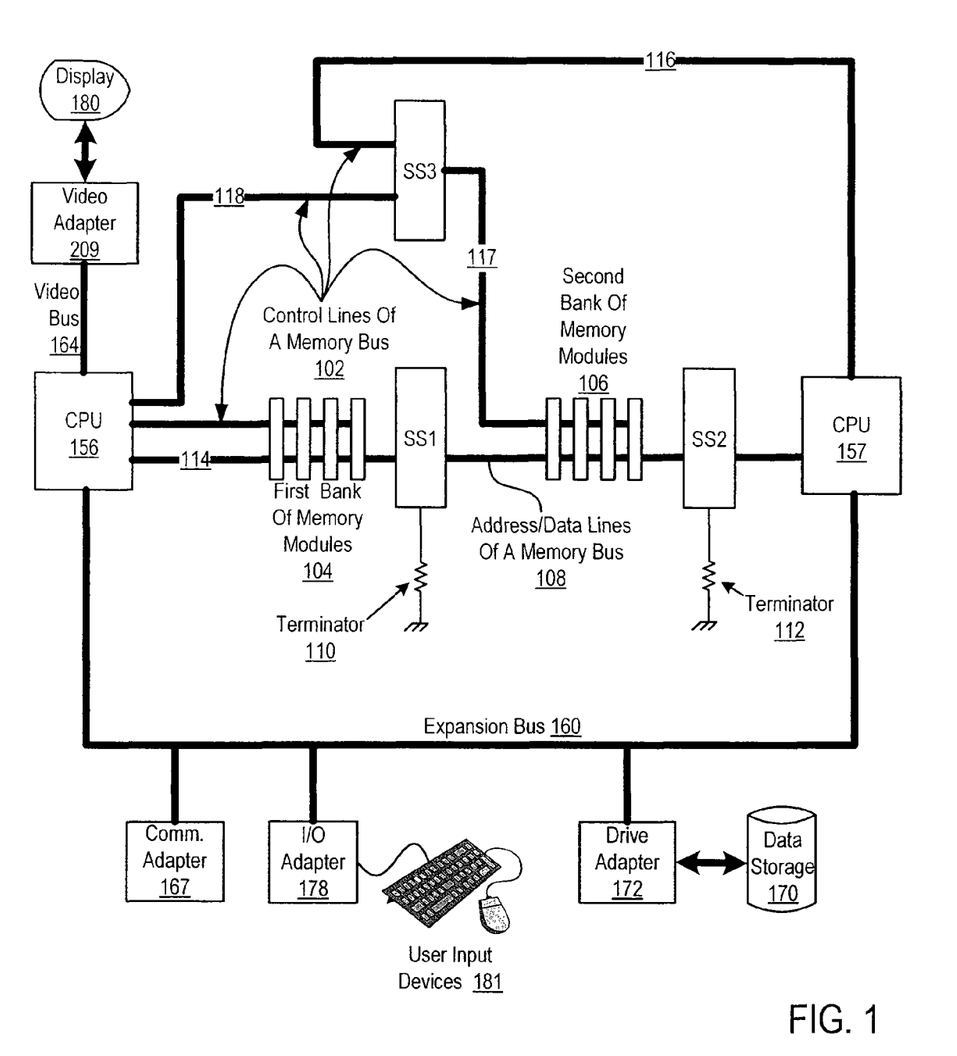
FIG. 1 sets forth a functional block diagram of an example data processing system that carries out memory switching according to embodiments of the present invention.

Exemplary methods, apparatus, and products for a memory switching data processing system in accordance with the present invention are described with reference to the accompanying drawings, beginning with FIG. 1. FIG. 1 sets forth a functional block diagram of an example data processing system that carries out memory switching according to embodiments of the present invention. The example data processing system of FIG. 1 includes one or more central processing units ('CPUs'). In this example, for ease of explanation, there are in fact two CPUs (156, 157), although data processing systems that effect memory switching according to embodiments of the present invention can include any number of CPUs as may occur to those of skill in the art, so long as there is at least one. The data processing system, however, is described as having "one or more" CPUs because the system supports two memory switching configurations, and, depending upon which configuration is in effect, the presence of a second CPU may be optional.

The example data processing system of FIG. 1 also includes random access memory organized in at least two banks (104, 106) of memory modules. In this example, for ease of explanation, the system includes only two banks (104, 106) of memory modules, although, again, data processing systems that effect memory switching according to embodiments of the present invention can include any number of banks of memory modules as may occur to those of skill in the art, so long as there are at least two. The memory modules may be implemented as single in-line memory modules ('SIMMs'), dual in-line memory modules ('DIMMS'), and in other form factors as will occur to those of skill in the art.

The example data processing system of FIG. 1 also includes one or more memory buses providing communications paths for data among the CPUs and the memory modules. In this example, the data buses are represented by a collection of address lines and data lines (108) and control lines (102) connecting the memory modules (104, 106) to the CPUs (156,157).

The example data processing system of FIG. 1 also includes a flexibly configurable memory bus switch that includes a first configuration adapting the first CPU (156) to a first bank (104) of memory modules and a second CPU (157) to a second bank (106) of memory modules and a second configuration adapting the first CPU (156) to both the first bank (104) of memory modules and the second bank (106) of memory modules. The memory bus switch in this example is represented by three switch segments, SS1, SS2, and SS3.

In the example of FIG. 1, the first configuration of the memory bus switch includes a switched coupling through switch segment SS1 of a memory bus (114) to a memory bus terminator (110) between the first (105) and second (106) banks of memory modules. The memory bus (114) operates at high signal speeds as a transmission line having a characteristic impedance, and, in order to reduce noise levels on the high speed memory bus (114), the memory bus terminator (110) presents an impedance that matches the characteristic impedance of the memory bus. The first configuration of the memory bus switch also includes a switched coupling through switch segment SS2 of the second CPU (157) to the second bank (106) of memory modules. And the first configuration of the memory bus switch also includes a switched coupling of memory control lines (116) through switch segment SS3 from the second CPU (157) to the second bank (106) of memory modules.

In the example of FIG. 1 the second configuration of the memory bus switch includes a switched coupling through switch segment SS1 of the first CPU (156) through the memory bus (114) to both memory modules (104, 106). That is, switch segment SS1 couples the memory bus straight through to the second bank (106) of memory modules rather than terminating the memory bus in its characteristic impedance between the banks of memory modules as was done in the first configuration of the memory bus switch. The second configuration of the memory bus switch also includes a switched coupling through switch segment SS2 of the memory bus (114) to a memory bus terminator (112) at the end of the memory bus opposite the first CPU (156). The memory bus terminator (112) presents an impedance that matches the characteristic impedance of the memory bus. The second configuration of the memory bus switch also includes a switched coupling of memory control lines (118) through switch segment SS3 from the first CPU (156) to the second bank (106) of memory modules. The effect of switching from the first configuration of the memory bus switch to the second configuration of the memory bus switch is to make the second bank (106) of memory modules available the first CPU (156) and to isolate the second bank of memory modules from the second CPU (157). When the memory bus switch is in the second configuration, in fact, the presence of the second CPU (157) is optional. In the second configuration of the memory bus switch, the second CPU (157) may be powered down or even removed from the system entirely.

The example data processing system of FIG. 1 includes a disk drive adapter (172) coupled through expansion bus (160) and to processor (156) and other components of the data processing system. Disk drive adapter (172) connects non-volatile data storage to the data processing system in the form of disk drive (170). Disk drive adapters useful in a memory switching data processing system according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example data processing system of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example data processing system of FIG. 1 includes a video adapter (209), which is an example of an I/O adapter specially designed for graphic output to a display device (180) such as a display screen or computer monitor. Video adapter (209) is connected to processor (156) through a high speed video bus (164).

The example data processing system of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications data communications networks such as IP data communications networks, and in other ways as will occur to those of skill in the art. Communications adapters implement the hardware level of data communications through which one computer sends data communications to another computer, directly or through a data communications network. Examples of communications adapters useful in a memory switching data processing system according to embodiments of the present invention include modems for wired dial-up communications, Ethernet (IEEE 802.3) adapters for wired data communications network communications, and 802.11 adapters for wireless data communications network communications.

The arrangement of CPUs, banks of memory modules, and other devices making up the example data processing system illustrated in FIG. 1 are for explanation, not for limitation. Data processing systems useful for memory switching according to various embodiments of the present invention may include additional CPUs, banks of memory modules, data buses, address buses, control lines, and other devices, not shown in FIG. 1, as will occur to those of skill in the art. Various embodiments of the present invention may be implemented on a variety of hardware platforms in addition to those illustrated in FIG. 1.

Figure 2A:
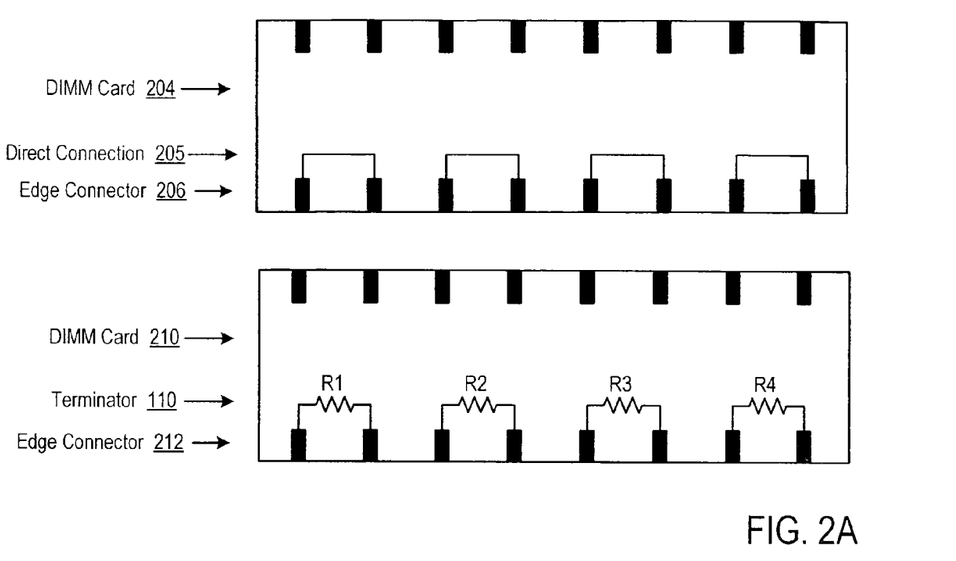
FIGS. 2A and 2B set forth line drawings of dual in-line memory module ('DIMM') cards useful in implementing a flexibly configured memory bus switch according to embodiments of the present invention.
Figure 2B:
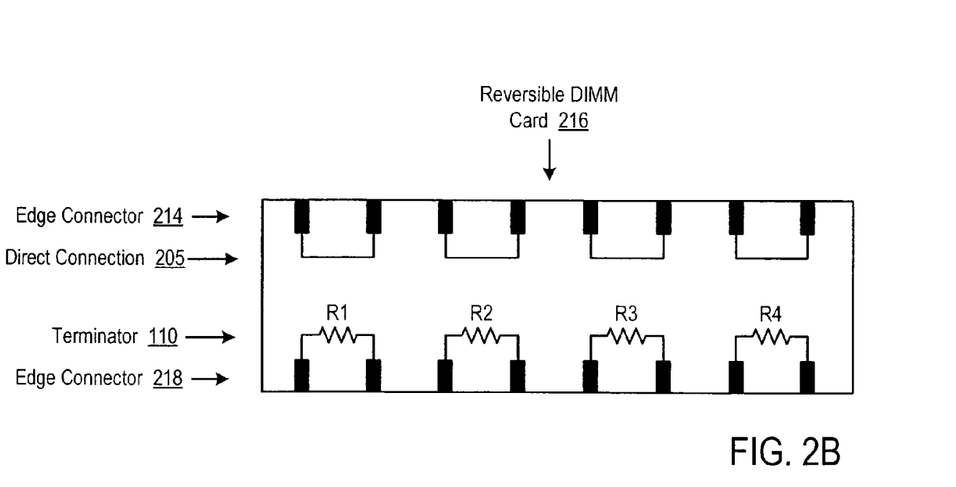

For further explanation, FIGS. 2A and 2B set forth line drawings of dual in-line memory module ('DIMM') cards useful in implementing a flexibly configured memory bus switch according to embodiments of the present invention. The example DIMM cards of FIGS. 2A and 2B are explained with reference both to FIG. 2 and also to FIG. 1.

FIG. 2A illustrates an example of two DIMM cards (204, 210) configured to implement a switch segment such as the one illustrated and described above as switch segment SS1. The DIMM cards in the example of FIG. 2A include a first DIMM card (210) that includes an edge connector (212) configured to adapt a first CPU only to a first bank of memory modules—as, for example, switch segment SS1 on FIG. 1. The edge connector (212) on the first DIMM card (210) is configured to adapt the first CPU only to the first bank of memory modules by terminating address and data lines of a memory bus (114) between memory banks (104, 106) with a memory bus terminator (110) that presents the characteristic impedances of the bus lines, R1, R2, R3, and so on.

The DIMM cards in the example of FIG. 2A also include a second DIMM card (204) that includes an edge connector (206) configured to adapt a first CPU (156) to both a first bank (104) of memory modules and also to a second bank (106) of memory modules. The edge connector (206) in the second DIMM card (204) is configured to adapt a first CPU (156) to both a first bank (104) of memory modules and also to a second bank (106) of memory modules by providing a direct connection (205) among address and data lines (108) in segments of a bus (114) connecting two banks (104, 106) of memory modules.

Taken together, the DIMM cards of FIG. 2A provide the functionality of switch segment SS1. When DIMM card (210) is plugged into a DIMM socket between segments of a bus connecting the two banks of memory modules at references (104, 106) on FIG. 1, for example, then CPU (156) is adapted only to the first bank (104) of memory modules, with its bus lines terminated, no through connections to the second bank (106) of memory modules. When DIMM card (210) is unplugged and DIMM card (204) is plugged into the same DIMM socket between the banks of memory modules, the CPU (156) is adapted to both the first bank (104) of memory modules and also the second bank (106) of memory modules by a direct connection (205) between segments of the bus (114) connecting the banks (104, 106) of memory modules.

FIG. 2B illustrates an example of a segment, such as switch segment SS1, of a flexibly configured memory bus switch implemented by a reversible DIMM card (216) that includes two edge connectors (214, 218). The reversible DIMM card (216) of FIG. 2B includes a first edge connector (218) configured to adapt a first CPU only to a first bank of memory modules. The edge connector (218) on the reversible DIMM card (216) is configured to adapt the first CPU only to the first bank of memory modules by terminating address and data lines of a memory bus (114) between memory banks (104, 106) with a memory bus terminator (110) that presents the characteristic impedances of the bus lines, R1, R2, R3, and so on.

The reversible DIMM card (216) of FIG. 2B also includes a second edge connector (214) configured to adapt the first CPU (156) to both the first bank (105) of memory modules and also to the second bank (106) of memory modules. The second edge connector (214) in the reversible DIMM card (216) is configured to adapt a first CPU (156) to both a first bank (104) of memory modules and also to a second bank (106) of memory modules by providing a direct connection (205) among address and data lines (108) in segments of a bus (114) connecting two banks (104, 106) of memory modules.

Taken together, the edge connectors (214, 218) of the reversible DIMM card (216) of FIG. 2B provide the functionality of switch segment SS1. When edge connector (218) is plugged into a DIMM socket between segments of a bus connecting the two banks of memory modules at references (104, 106) on FIG. 1, for example, then CPU (156) is adapted only to the first bank (104) of memory modules, with its bus lines terminated, no through connections to the second bank (106) of memory modules. When the reversible DIMM card (218) is unplugged and reversed, and edge connector (214) is plugged into the same DIMM socket between the banks of memory modules, the CPU (156) is adapted to both the first bank (104) of memory modules and also the second bank (106) of memory modules by a direct connection (205) between segments of the bus (114) connecting the banks (104, 106) of memory modules. In view of this explanation, readers will recognize that the entire flexibly configurable memory bus switch in the system of FIG. 1, including switch segments SS1, SS2, and SS3, can be implemented with one or more DIMM cards having edge connectors wired with pass-throughs or shorts and memory bus terminators.

Figure 3:
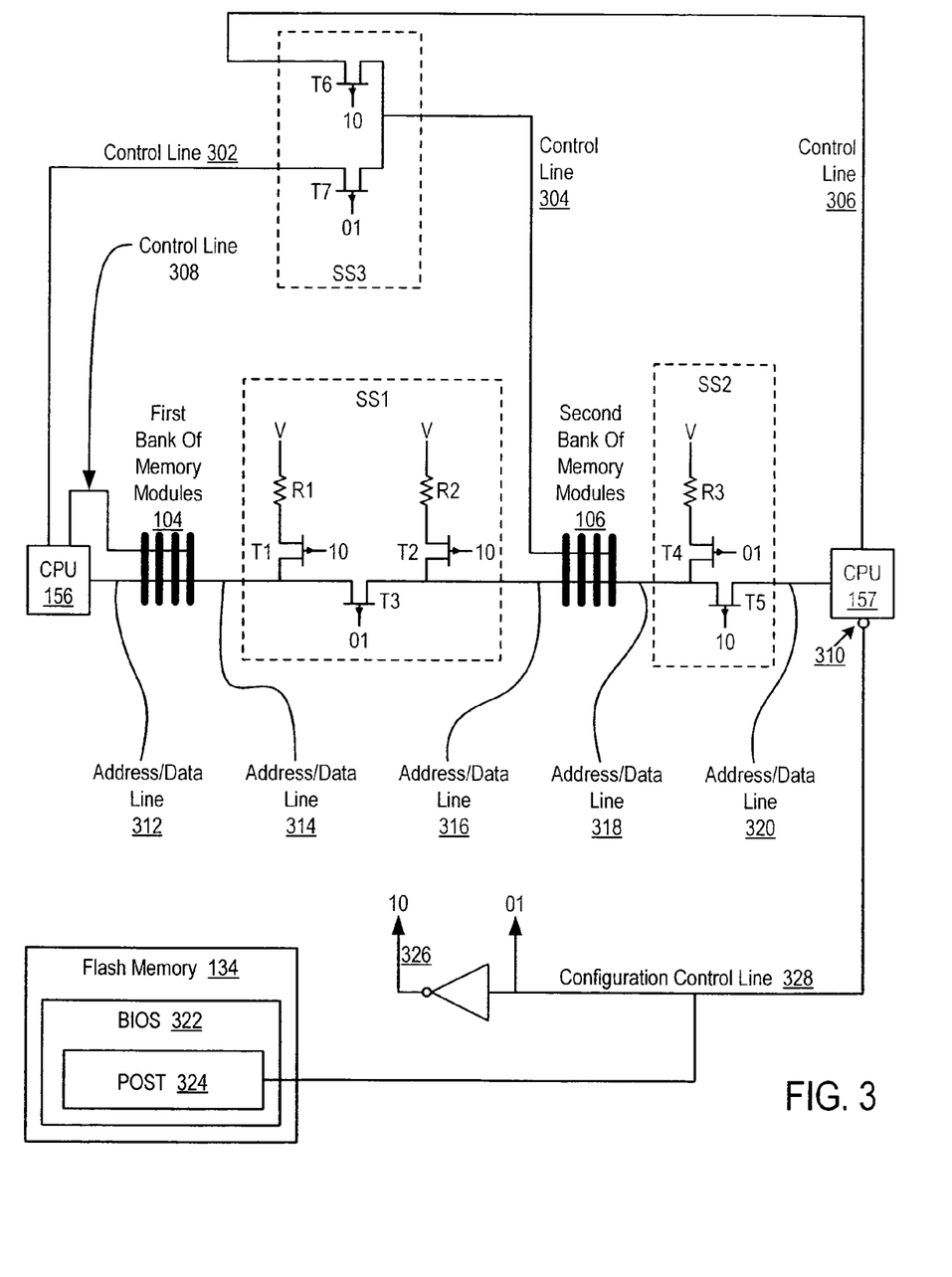
FIG. 3 sets forth a schematic diagram of a further example data processing system that carries out memory switching according to embodiments of the present invention.

For further explanation, FIG. 3 sets forth a schematic diagram of a further example data processing system that carries out memory switching according to embodiments of the present invention. Like the example data processing system of FIG. 1, the example data processing system of FIG. 3 includes one or more central processing units ('CPUs'), random access memory organized in at least two banks (104, 106) of memory modules, one or more memory buses providing communications paths for data among the CPUs and the memory modules (represented in this example by address lines and data lines (312-320) and control lines (302-308) connecting the banks of memory modules to the CPUs), and a flexibly configurable memory bus switch (represented by three switch segments, SS1, SS2, and SS3) that includes a first configuration adapting the first CPU (156) to a first bank (104) of memory modules and a second CPU (157) to a second bank (106) of memory modules and a second configuration adapting the first CPU (156) to both the first bank (104) of memory modules and the second bank (106) of memory modules.

In the example of FIG. 3, however, the flexibly configured memory bus switch is implemented as an electronic switch. The electronic switch is implemented in three switch segments, SS1, SS2, and SS3, built of seven transistors, T1-T7. Each transistor is operated as an electronic switch that is driven either on or off for either the first configuration or the second configuration of the memory bus switch. The gate if each transistor is labeled with two logic states, either 01 or 10, representing the condition of the transistor, on or off, in the first configuration and the second configuration respectively of the memory bus switch. Each transistor may be driven into the state required for the first or second configuration of the memory bus switch by connection to the configuration control line (328) or an inversion (326) of the configuration control line (328).

In this example, the CPU (157) includes a presence pin (310) that drives the configuration control line active when CPU (157) is present in the system and power is applied to CPU (157). The configuration control line (328) and the presence pin (310) together make up an electronic CPU presence detection circuit that is enabled to set the flexibly configurable memory bus switch to the first configuration or to the second configuration depending upon whether the CPU (157) is present in the system. That is, in this example, the configuration control line (328) and the presence pin (310) together make up an electronic CPU presence detection circuit that is enabled to set the flexibly configurable memory bus switch to the first configuration or to the second configuration in dependence upon whether the data processing system comprises one CPU or more than one CPU. If only CPU (156) is present in the system, the memory bus switch is set to the second configuration, connecting the second bank (106) of memory modules to CPU (156). If both CPUs (156, 157) are present in the system, the memory bus switch is set to the first configuration, connecting the second bank (106) of memory modules to CPU (157). Note that detecting the presence of CPU (157) with its presence pin can be carried out directly with hard-wired electronics, with no program control.

In addition, however, presence detection for one or more additional CPUs with attendant setting of the configuration of a memory bus switch can be carried out under program control. The system of FIG. 3 includes computer program instructions enabled to set the flexibly configurable memory bus switch to the first configuration or to the second configuration—illustrated here as computer program instructions of a Power On Self Test ('POST') routine (324) in a basic I/O system ('BIOS') (322) stored in electrically erasable programmable read only memory ('EEPROM') or 'Flash Memory' (134). The POST routine inventories system resources at boot time and is enabled to drive the configuration control line (328) so as to set the flexibly configurable memory bus switch to the first configuration or to the second configuration in dependence upon whether the data processing system comprises one CPU (156) or more than one CPU (156, 157).

First Configuration

In the example of FIG. 3, the first configuration of the memory bus switch includes a switched coupling through switch segment SS1 of a memory bus (segment 314) to a memory bus terminator R1 between the first (105) and second (106) banks of memory modules. The memory bus (address/data line segments 312-320) operates at high signal speeds as a transmission line having a characteristic impedance, and, in order to reduce noise levels on the high speed memory bus, the memory bus terminator R1 presents to segment (314) an impedance that matches the characteristic impedance of the memory bus. The switched coupling through switch segment SS1 of the memory bus (address/data line segment 314) to memory bus terminator R1 is implemented with transistors T1 and T2 both on and transistor T3 off, thereby terminating both address/data line segments (314, 316) in their characteristic impedances R1 and R2 respectively and decoupling CPU (156) from access through address/data line segments (314, 316) to the second bank (106) of memory modules.

The first configuration of the memory bus switch also includes a switched coupling through switch segment SS2 of the second CPU (157) to the second bank (106) of memory modules. The switched coupling through switch segment SS2 of the second CPU (157) to the second bank (106) of memory modules in this example is implemented with transistor T4 off and transistor T5 on, thereby decoupling the memory bus terminator R3 and providing a direct connection for CPU (157) through transistor T5 and address/data line segments (318, 320) to the second bank (106) of memory modules.

The first configuration of the memory bus switch also includes a switched coupling of memory control line (306) through switch segment SS3 from the second CPU (157) to the second bank (106) of memory modules. The switched coupling of memory the control lines (306) through switch segment SS3 from the second CPU (157) to the second bank (106) of memory modules is implemented with transistor T6 on and transistor T7 off, thereby connecting control line (306) through transistor T6 to control line (304) and the second bank (106) of memory modules—while at the same time decoupling control line (302) from control line (304) and the second bank (106) of memory modules.

Second Configuration

In the example of FIG. 3, the second configuration of the memory bus switch includes a switched coupling through switch segment SS1 of the first CPU (156) through the memory bus (address/data line segments 312-318) to both memory modules (104, 106). That is, switch segment SS1 couples the memory bus straight through to the second bank (106) of memory modules rather than terminating the memory bus in its characteristic impedance between the banks of memory modules as was done in the first configuration of the memory bus switch. The switched coupling through switch segment SS1 of the first CPU (156) through the memory bus to both memory modules is implemented with transistors T1 and T2 both off and transistor T3 on, thereby decoupling both address/data line segments (314, 316) from memory bus terminators R1 and R2 and coupling CPU (156) through address/data line segments (314, 316) to the second bank (106) of memory modules.

The second configuration of the memory bus switch also includes a switched coupling through switch segment SS2 of the memory bus (114) to a memory bus terminator R3 at the end of the memory bus opposite the first CPU (156). The memory bus terminator R3 presents an impedance that matches the characteristic impedance of the memory bus (address/data line segment 318). The switched coupling through switch segment SS2 of the memory bus (114) to a memory bus terminator R3 at the end of the memory bus opposite the first CPU (156) in this example is implemented with transistor T4 on and transistor T5 off, thereby coupling the memory bus terminator R3 to address/data line segment (318) and decoupling CPU (157) from the second bank (106) of memory modules.

The second configuration of the memory bus switch also includes a switched coupling of memory control lines (118) through switch segment SS3 from the first CPU (156) to the second bank (106) of memory modules. The switched coupling of memory control lines (118) through switch segment SS3 from the first CPU (156) to the second bank (106) of memory modules is implemented with transistor T6 off and transistor T7 on, thereby connecting control line (302) through transistor T7 to control line (304) and the second bank (106) of memory modules—while at the same time decoupling control line (306) from control line (304) and the second bank (106) of memory modules.

In the example data processing system of FIG. 3, like the example of FIG. 1, the effect of switching from the first configuration of the memory bus switch to the second configuration of the memory bus switch is to make the second bank (106) of memory modules available the first CPU (156) and to isolate the second bank of memory modules from the second CPU (157). When the memory bus switch is in the second configuration, in fact, the presence of the second CPU (157) is optional. In the second configuration of the memory bus switch, the second CPU (157) may be powered down or even removed from the system entirely.

Figure 4:
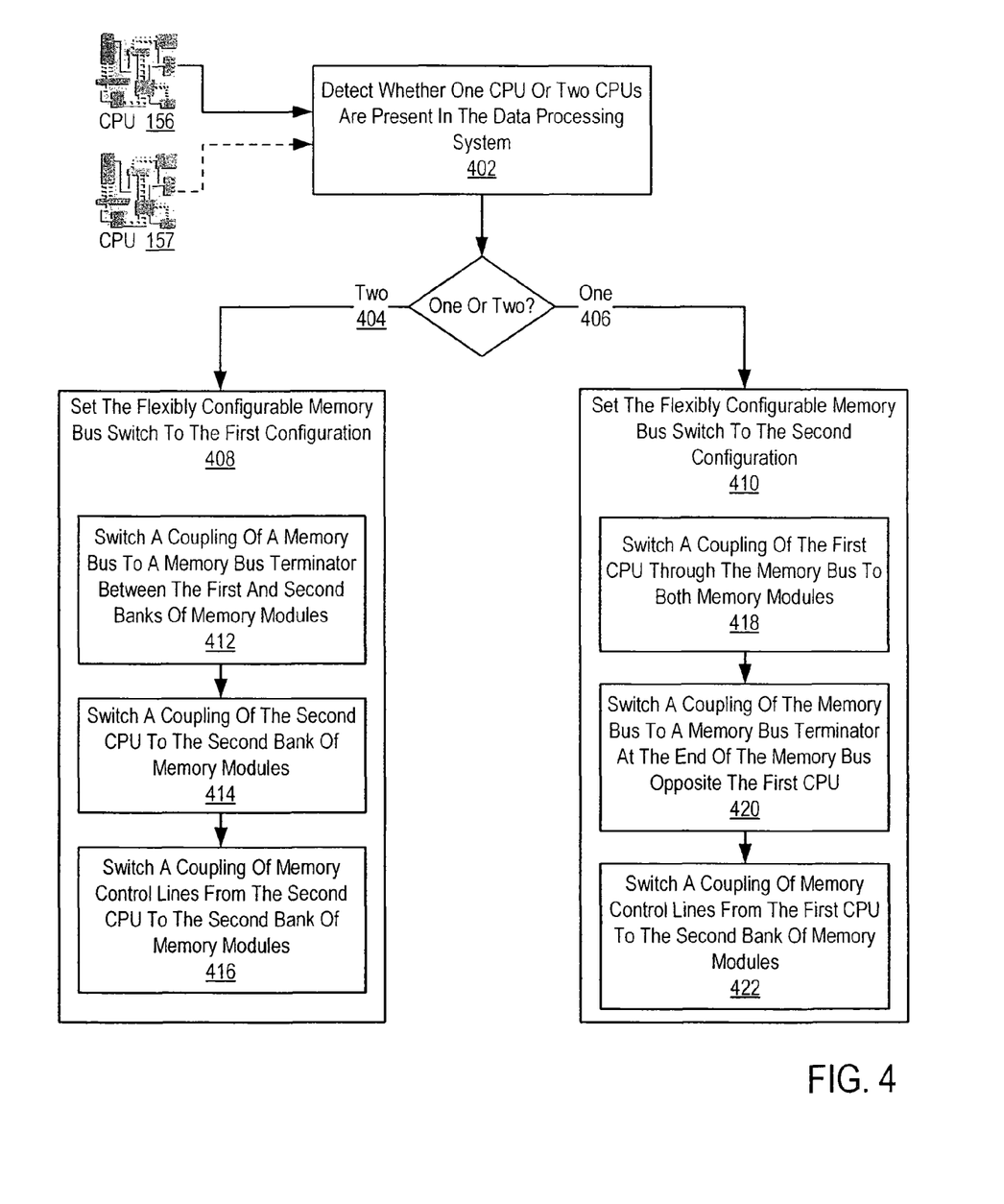
FIG. 4 sets forth a flow chart illustrating an exemplary method of memory switching data in a processing system according to embodiments of the present invention.

For further explanation, FIG. 4 sets forth a flow chart illustrating an exemplary method of memory switching data in a processing system according to embodiments of the present invention. The method of FIG. 4 is described here with reference both the FIG. 4 and also to FIG. 1. The method of FIG. 4 is implemented on a data processing system similar to the systems illustrated in FIGS. 1 and 3, a data processing system that includes one or more CPU (156, 157), random access memory organized in at least two banks (104, 106) of memory modules, one or more memory buses (114, 118) providing communications paths for data among the CPUs and the memory modules, and a flexibly configurable memory bus switch (represented by switch segments SS1, SS2, and SS3) comprising a first configuration adapting the first CPU (156) to a first bank (104) of memory modules and a second CPU (157) to a second bank (106) of memory modules and a second configuration adapting the first CPU (156) to both the first bank (104) of memory modules and the second bank (106) of memory modules, The method of FIG. 4 includes detecting (402) whether one CPU or two CPUs are present in the data processing system. Detecting (402) whether one CPU or two CPUs are present in the data processing system can be carried out, for example, by a presence detection circuit such as the one comprised by the presence detection pin and the configuration control line described above and illustrated at references (310) and (328) on FIG. 3. Alternatively, detecting (402) whether one CPU or two CPUs are present in the data processing system can be carried out by computer program code of a Power On Self Test ('POST') routine (324 on FIG. 3) in a basic I/O system ('BIOS') (322 on FIG. 3) stored in electrically erasable programmable read only memory ('EEPROM') or 'Flash Memory' (134 on FIG. 3). The POST routine inventories system resources at boot time and is enabled to drive the configuration control line (328 on FIG. 3) so as to set the flexibly configurable memory bus switch to the first configuration or to the second configuration in dependence upon whether the data processing system comprises one CPU (156) or more than one CPU (156, 157).

The method of FIG. 4 also includes setting (408) the flexibly configurable memory bus switch (SS1, SS2, SS3) to the first configuration if two CPUs are present in the data processing system (404) and setting (410) the flexibly configurable memory bus switch to the second configuration if only one CPU is present in the data processing system (406). In the method of FIG. 4, setting (408) the flexibly configurable memory bus switch to the first configuration includes:

switching (412) a coupling of a memory bus (114) to a memory bus terminator (110) between the first (104) and second (106) banks of memory modules;
switching (414) a coupling of the second CPU (157) to the second bank (106) of memory modules; and
switching (416) a coupling of memory control lines (116, 117) from the second CPU (157) to the second bank (106) of memory modules.

In the method of FIG. 4, setting (410) the flexibly configurable memory bus switch to the second configuration includes:

switching (418) a coupling of the first CPU (156) through the memory bus (114) to both banks (104, 106) of memory modules;
switching (420) a coupling of the memory bus (114) to a memory bus terminator (112) at the end of the memory bus (114) opposite the first CPU (156); and
switching (422) a coupling of memory control lines (118, 117) from the first CPU (156) to the second bank (106) of memory modules.

Figure 5:
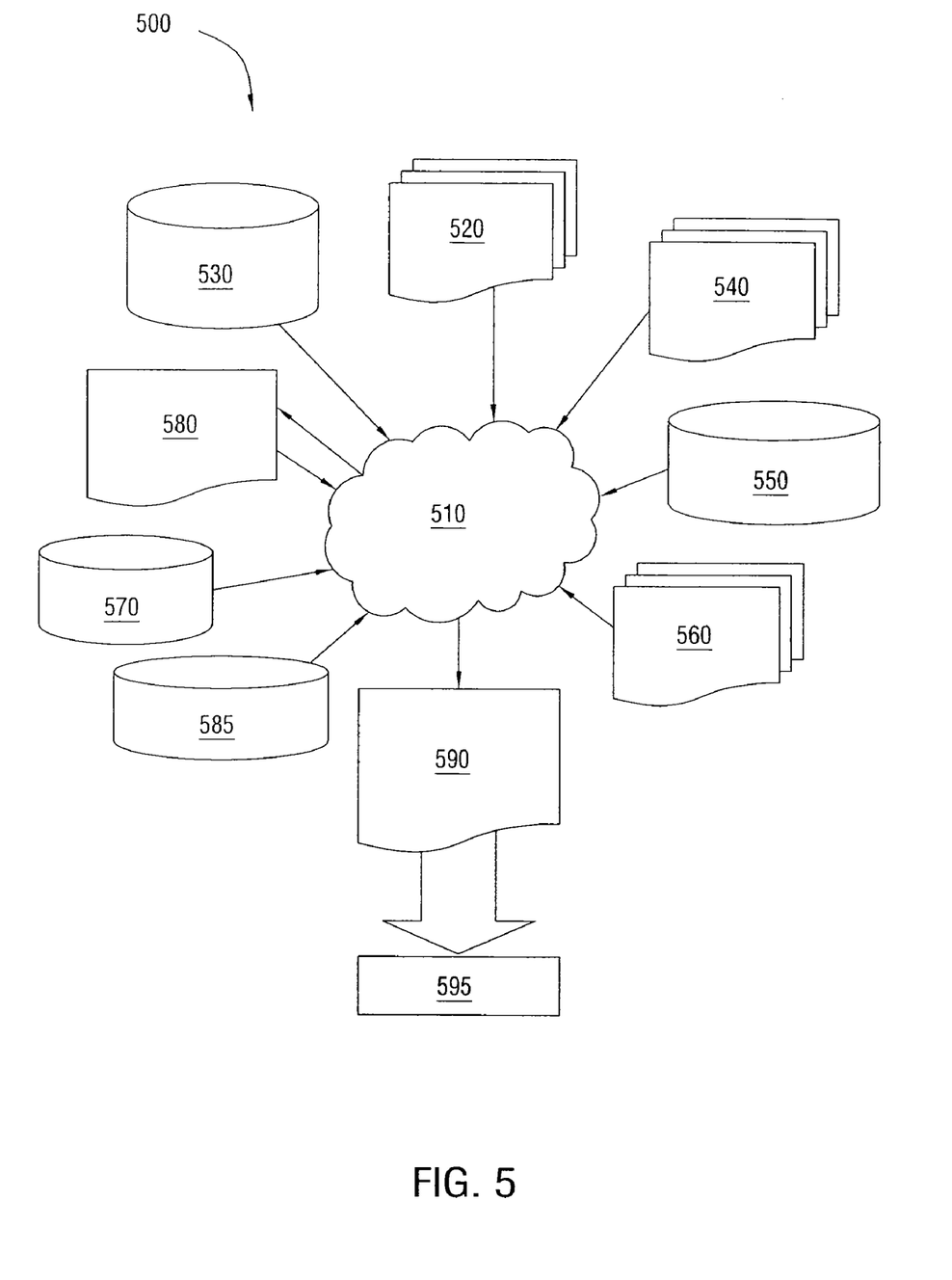
FIG. 5 is a flow diagram of a design process used in semiconductor design, manufacture, and /or test.

FIG. 5 shows a block diagram of an exemplary design flow (500) used for example, in semiconductor design, manufacturing, and/or test. Design flow (500) may vary depending on the type of IC being designed. For example, a design flow (500) for building an application specific IC (ASIC) may differ from a design flow (500) for designing a standard component. Design structure (520) is preferably an input to a design process (510) and may come from an IP provider, a core developer, or other design company or may be generated by the operator of the design flow, or from other sources. Design structure (520) comprises the circuits described above and shown in FIGS. 1 and 3 in the form of schematics or HDL, a hardware-description language (e.g., Verilog, VHDL, C, etc.). Design structure (520) may be contained on one or more machine readable medium. For example, design structure (520) may be a text file or a graphical representation of a circuit as described above and shown in FIGS. 1 and 3. Design process (510) preferably synthesizes (or translates) the circuit described above and shown in FIGS. 1 and 3 into a netlist (580), where netlist (580) is, for example, a list of wires, transistors, logic gates, control circuits, I/O, models, etc. that describes the connections to other elements and circuits in an integrated circuit design and recorded on at least one of machine readable medium. For example, the medium may be a storage medium such as a CD, a compact flash, other flash memory, or a hard-disk drive. The medium may also be a packet of data to be sent via the Internet, or other networking suitable means. The synthesis may be an iterative process in which netlist 580 is resynthesized one or more times depending on design specifications and parameters for the circuit.

Design process (510) may include using a variety of inputs; for example, inputs from library elements (530) which may house a set of commonly used elements, circuits, and devices, including models, layouts, and symbolic representations, for a given manufacturing technology (e.g., different technology nodes, 32 nm, 45 nm, 90 nm, etc.), design specifications (540), characterization data (550), verification data (560), design rules (570), and test data files (585) (which may include test patterns and other testing information). Design process (510) may further include, for example, standard circuit design processes such as timing analysis, verification, design rule checking, place and route operations, etc. One of ordinary skill in the art of integrated circuit design can appreciate the extent of possible electronic design automation tools and applications used in design process (510) without deviating from the scope and spirit of the invention. The design structure of the invention is not limited to any specific design flow.

Design process (510) preferably translates a circuit as described above and shown in FIGS. 1 and 3, along with any additional integrated circuit design or data (if applicable), into a second design structure (590). Design structure (590) resides on a storage medium in a data format used for the exchange of layout data of integrated circuits (e.g. information stored in a GDSII (GDS2), GL1, OASIS, or any other suitable format for storing such design structures). Design structure (590) may comprise information such as, for example, test data files, design content files, manufacturing data, layout parameters, wires, levels of metal, vias, shapes, data for routing through the manufacturing line, and any other data required by a semiconductor manufacturer to produce a circuit as described above and shown in FIGS. 1 and 3. Design structure (590) may then proceed to a stage (595) where, for example, design structure (590): proceeds to tape-out, is released to manufacturing, is released to a mask house, is sent to another design house, is sent back to the customer, etc.

In view of the explanations set forth above, readers will recognize that the benefits of a memory switching data processing system according to embodiments of the present invention include providing a data processing systems with a tight form factor such as, for example, a blade server, having a single overall circuit design that will nevertheless support both single-CPU operation as well as multiple-CPU operation, apportioning memory among processors in multiple-CPU operation while making all memory available for single-CPU operation—more flexible and less expensive to manufacture than the prior art solutions of designing and manufacturing a second entire blade server for single CPU applications, or designing and manufacturing a two-piece blade server, with single and dual CPU versions of the processor complex.

Exemplary embodiments of the present invention are described largely in the context of a fully functional computer system for a memory switching data processing system.

Readers of skill in the art will recognize, however, that the present invention also may be embodied in a computer program product disposed on signal bearing media for use with any suitable data processing system. Such signal bearing media may be transmission media or recordable media for machine-readable information, including magnetic media, optical media, or other suitable media. Examples of recordable media include magnetic disks in hard drives or diskettes, compact disks for optical drives, magnetic tape, and others as will occur to those of skill in the art. Examples of transmission media include telephone networks for voice communications and digital data communications networks such as, for example, Ethernets™ and networks that communicate with the Internet Protocol and the World Wide Web as well as wireless transmission media such as, for example, networks implemented according to the IEEE 802.11 family of specifications. Persons skilled in the art will immediately recognize that any computer system having suitable programming means will be capable of executing the steps of the method of the invention as embodied in a program product. Persons skilled in the art will recognize immediately that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A design structure embodied in a machine readable storage medium for at least one of designing, manufacturing, and testing a design, the design structure comprising:
    a memory switching data processing system comprising:
        one or more central processing units ('CPUs');
        random access memory organized in at least two banks of memory modules;
        one or more memory buses providing one or more communications paths for data among the one or more CPUs and the at least two banks of memory modules; and
        a flexibly configurable memory bus switch implemented separately from the at least two banks of memory modules, wherein the switch comprises a first configuration adapting a first CPU to a first bank of memory modules and a second CPU to a second bank of memory modules and a second configuration adapting the first CPU to both the first bank of memory modules and the second bank of memory modules, and wherein one or more segments of the switch are implemented by a plurality of dual in-line memory module ('DIMM') cards, the plurality comprising a first DIMM card including a first edge connector configured to adapt the first CPU only to the first bank of memory modules and a second DIMM card including a second edge connector configured to adapt the first CPU to both the first bank of memory modules and the second bank of memory modules.

2. The design structure of claim 1, wherein the first configuration comprises:
    a switched coupling of a memory bus among the one or more memory buses to a memory bus terminator between the first bank of memory modules and the second bank of memory modules;
    a switched coupling of the second CPU to the second bank of memory modules; and
    a switched coupling of memory control lines from the second CPU to the second bank of memory modules.

3. The design structure of claim 2, wherein the memory bus terminator comprises an impedance that matches a characteristic impedance of the memory bus.

4. The design structure of claim 1, wherein the second configuration comprises:
    a switched coupling of the first CPU through a memory bus among the one or more memory buses to both the first bank of memory modules and the second bank of memory modules;
    a switched coupling of the memory bus to a memory bus terminator at an end of the memory bus opposite the first CPU; and
    a switched coupling of memory control lines from the first CPU to the second bank of memory modules.

5. The design structure of claim 4, wherein the memory bus terminator comprises an impedance that matches a characteristic impedance of the memory bus.

6. The design structure of claim 1, wherein the plurality of dual in-line memory module ('DIMM') cards further comprise a reversible DIMM card comprising:
    a first edge connector configured to adapt the first CPU only to the first bank of memory modules; and
    a second edge connector configured to adapt the first CPU to both the first bank of memory modules and the second bank of memory modules.

7. The design structure of claim 1, further comprising an electronic CPU presence detection circuit enabled to set the flexibly configurable memory bus switch to the first configuration or to the second configuration.

8. The design structure of claim 1, further comprising an electronic CPU presence detection circuit enabled to set the flexibly configurable memory bus switch to the first configuration or to the second configuration in dependence upon whether the memory switching data processing system comprises one CPU or more than one CPU.

9. The design structure of claim 1, further comprising computer program instructions enabled to set the flexibly configurable memory bus switch to the first configuration or to the second configuration.

10. The design structure of claim 1, further comprising computer program instructions enabled to set the flexibly configurable memory bus switch to the first configuration or to the second configuration in dependence upon whether the memory switching data processing system comprises one CPU or more than one CPU.

11. The design structure of claim 1, further comprising a netlist that describes the memory switching data processing system.

12. The design structure of claim 1, wherein the design structure resides on the machine readable storage medium as a data format used for an exchange of layout data of integrated circuits.

13. A design structure embodied in a machine readable storage medium for at least one of designing, manufacturing, and testing a design, the design structure comprising:
    a memory switching data processing system comprising:
        one or more central processing units ('CPUs');
        random access memory organized in at least two banks of memory modules;

one or more memory buses providing one or more communications paths for data among the one or more CPUs and the at least two banks of memory modules; and a flexibly configurable memory bus switch, wherein the switch comprises a first configuration adapting a first CPU to a first bank of memory modules and a second CPU to a second bank of memory modules and a second configuration adapting the first CPU to both the first bank of memory modules and the second bank of memory modules, and wherein the switch further comprises a first DIMM card comprising a first edge connector configured to adapt the first CPU only to the first bank of memory modules and a second DIMM card comprising a second edge connector configured to adapt the first CPU to both the first bank of memory modules and the second bank of memory modules.

14. The design structure of claim 13, wherein the first configuration comprises:

a switched coupling of a memory bus among the one or more memory buses to a memory bus terminator between the first bank of memory modules and the second bank of memory modules;

a switched coupling of the second CPU to the second bank of memory modules; and a switched coupling of memory control lines from the second CPU to the second bank of memory modules.

15. The design structure of claim 13, wherein the second configuration comprises:

a switched coupling of the first CPU through a memory bus among the one or more memory buses to both the first bank of memory modules and the second bank of memory modules;

a switched coupling of the memory bus to a memory bus terminator at an end of the memory bus opposite the first CPU; and a switched coupling of memory control lines from the first CPU to the second bank of memory modules.

16. The design structure of claim 13, further comprising an electronic CPU presence detection circuit enabled to set the flexibly configurable memory bus switch to the first configuration or to the second configuration.

17. The design structure of claim 13, further comprising a netlist that describes the memory switching data processing system.

18. The design structure of claim 13, wherein the design structure resides on the machine readable storage medium as a data format used for an exchange of layout data of integrated circuits.

* * * * *